(12) United States Patent
Jeon et al.

(10) Patent No.: US 6,432,750 B2
(45) Date of Patent: Aug. 13, 2002

(54) POWER MODULE PACKAGE HAVING INSULATOR TYPE HEAT SINK ATTACHED TO REAR SURFACE OF LEAD FRAME AND MANUFACTURING METHOD THEREOF

(75) Inventors: Gi-young Jeon; Eul-bin Im; Byeong Gon Kim; Eun-ho Lee, all of Bucheon (KR)

(73) Assignee: Fairchild Korea Semiconductor Ltd., Kyungki-do (KR)

( * ) Notice: Subject to any disclaimer, the term of this patent is extended or adjusted under 35 U.S.C. 154(b) by 0 days.

(21) Appl. No.: 09/789,557

(22) Filed: Feb. 22, 2001

(30) Foreign Application Priority Data

Jun. 13, 2000 (KR) .............................................. 00-32383

(51) Int. Cl.[7] .......................... H01L 21/44; H01L 23/34
(52) U.S. Cl. ....................... 438/122; 438/112; 438/123; 438/124; 257/675; 257/706; 257/712; 257/724; 257/796
(58) Field of Search ................................ 438/106, 112, 438/107, 122, 123, 124, 125, 126, 127; 257/675, 676, 691, 706, 712, 713, 717, 718, 723, 724, 796

(56) References Cited

U.S. PATENT DOCUMENTS

| | | | | |
|---|---|---|---|---|
| 5,057,906 A | * | 10/1991 | Ishigami | 257/706 |
| 5,466,969 A | * | 11/1995 | Tsunoda | 257/706 |
| 5,703,399 A | | 12/1997 | Majumdar et al. | |
| 6,060,772 A | * | 5/2000 | Sugawara et al. | 257/691 |
| 6,066,890 A | * | 5/2000 | Tsui et al. | 257/723 |
| 6,083,772 A | * | 7/2000 | Bowman et al. | 438/106 |
| 6,313,520 B1 | * | 11/2001 | Yoshida et al. | 257/676 |

FOREIGN PATENT DOCUMENTS

EP      0 774 782 A2      5/1997

* cited by examiner

*Primary Examiner*—Kevin M. Picardat
(74) *Attorney, Agent, or Firm*—Rothwell, Figg, Ernst & Manbeck

(57) ABSTRACT

A power module package in which a heat sink made of an insulating material is attached directly to a second surface of a lead frame, on which a down set is provided, and exposed to the outside, and a manufacturing method thereof are provided. A general rectangular plate or pre-bent plate may be used as the heat sink. The heat sink may be attached during a sealing process or through a separate process performed after the sealing process. The power module package has an improved heat radiation characteristic.

18 Claims, 5 Drawing Sheets

POWER MODULE PACKAGE HAVING INSULATOR TYPE HEAT SINK ATTACHED TO REAR SURFACE OF LEAD FRAME AND MANUFACTURING METHOD THEREOF

BACKGROUND OF THE INVENTION

1. Field of the Invention

The present invention relates to a semiconductor package, and more particularly, to a power module package having improved heat radiating characteristics.

2. Description of the Related Art

In general, a semiconductor package is mounted on a print circuit board after mounting one or a plurality of semiconductor chips on a chip pad within a lead frame and sealing with epoxy molding compound (EMC) to protect the internal part. However, as high-speed, large scale and highly integrated electronic devices have been rapidly developed in recent times, techniques that allow for low cost, miniature, and lightweight manufacturing are also required for power devices which are applied to automobiles, industrial equipments and household electric appliances. Furthermore power devices requires low noise and high reliability. Thus, power module packages in which a plurality of semiconductor chips are mounted on one semiconductor package become increasingly popular.

FIG. 1 is a cross sectional view of a conventional power module package. The power module package shown in FIG. 1 is disclosed in U.S. Pat. No. 5,703,399 for a semiconductor power module filed on May 15, 1996. Referring to FIG. 1, the power module package has a structure in which a plurality of semiconductor chips constituting a power circuit 9 and a control circuit 8 are mounted on a lead frame 3. Reference numerals 1, 2, 4a, 5a, 5b, 6a, 6b, and 7 denote a heat sink, a resin having good heat transfer properties, a power circuit chip element, a control circuit chip element, a resistance element, an aluminum bonding wire, a gold wire, and an insulating EMC, respectively.

According to the conventional art, in order to effectively give off heat which is generated in the power circuit chip element 4a, the highly heat conducting resin 2 is provided beneath the lead frame 3, and the heat sink 1 made of copper is provided under the lead frame 3 so that it may be slightly separated from the lead frame 3. The resin provided on the top of the lead frame is a general insulating EMC 7 other than the resin 2. In addition, there are a plurality of embodiments in which the heat sink 1 and the lead frame 3 are transformed in order to more effectively radiate heat generated in the power circuit chip element 4a.

However, the conventional art encounters the following problems. First, since an EMC still remains filled between the rear surface of the lead frame 3 and the heat sink 1 made of copper, there is a restriction of emitting heat generated by the power circuit chip element 4a to the outside of the power module package. Second, use of two different resins within one power module package not only complicates a manufacturing process of the power module package but also makes automation of the manufacturing process difficult. Third, use of a heat sink made of copper and the complicated manufacturing process increases the manufacturing cost.

SUMMARY OF THE INVENTION

To solve the above problems, it is an objective of the present invention to provide a power module package which can improve heat radiation characteristic, simplify a process, and lower the manufacturing cost.

It is another objective of the present invention to provide a method of manufacturing the power module package.

Accordingly, to achieve the above objectives, the present invention provides a power module package including: a lead frame having a first surface, to which components for a power circuit and a control circuit are attached and on the center of which a down set is provided, and a second surface, to which a heat sink is attached, and edges on which external terminals are provided; a heat sink having one surface attached directly to the second surface of the lead frame projected by the down set, and the other surface exposed to the outside of a power module package, the heat sink being formed of an insulating material having good heat transfer properties; components for the power circuit which are mounted on a portion of the first surface of the lead frame on which the down set is formed; components for the control circuit which are mounted on the first surface of the lead frame; and an epoxy molding compound which encapsulates the lead frame and the heat sink excluding the external terminals of the lead frame and the one side of the heat sink.

Preferably, the heat sink formed of an insulating material having good heat transfer properties is composed of plastic or ceramic including at least one of $Al_2O_3$, AlN, $SiO_2$, and BeO.

Preferably, the heat sink is a pre-bent plate for preventing package warpage and it is pre-bent to less than 100 μm.

Preferably, the heat sink is protruded slightly more than the epoxy molding compound. The heat sink is protruded 0.05–0.1 mm greater than the epoxy molding compound.

The present invention provides a method of manufacturing a power module package. According to the method, a lead frame, on the center of which a down set is provided and on the edges of which external terminals are provided, is prepared. A plurality of chips for serving as a power circuit and a control circuit are attached to a first surface of the lead frame and then wire bonding is performed. The lead frame is positioned to a molding equipment for attaching a heat sink formed of an insulating material to a bottom mold die. The lead frame is sealed by an epoxy molding compound in the molding equipment so that the heat sink may be attached to the second surface of the lead frame on which the down set is formed, and that the external terminals and a surface opposing the surface of the heat sink to which the lead frame is attached may be exposed to the outside. In this case, a groove for fixing the heat sink is formed to a depth of 0.05–0.1 mm from the surface of the bottom mold die of the molding equipment.

The present invention also provides a method of manufacturing a power module package. According to the method, a lead frame on the center of which a down set is provided and on the edges of which external terminals are provided is prepared. A plurality of chips for serving as a power circuit and a control circuit are attached to a first surface of the lead frame and wire bonding is performed. The lead frame is positioned to a molding equipment, in which a protrusion portion for attaching a heat sink to a bottom lower die in a subsequent process is formed. The lead frame is sealed by an epoxy molding compound in the molding equipment so that a recessed surface including the second surface of the lead frame, on which the down set is provided, and the external terminals of the lead frame may be exposed. The heat sink is attached to the recessed portion including the second surface of the lead frame exposed to the outside.

The power module package according to the present invention can effectively radiate heat generated during its operation through a heat sink directly attached to the rear surface of a lead frame on which a down set is formed. Thus, reliability of the power module package can be guaranteed.

Furthermore, a sealing process for the power module package can be performed at one time by using resins having the same properties, thus simplifying a process and being advantageous to automation of the process itself.

Lastly, the power module package uses a low cost heat sink instead of metal thus lowering the manufacturing cost.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF THE INVENTION

Arrangement of parts of a power circuit and a control circuit and the structures of a lead frame and a heat sink, which will be described in this specification, are only examples, and the present invention will not be restricted to a specific shape as shown in the accompanying drawings.

Figure 1:
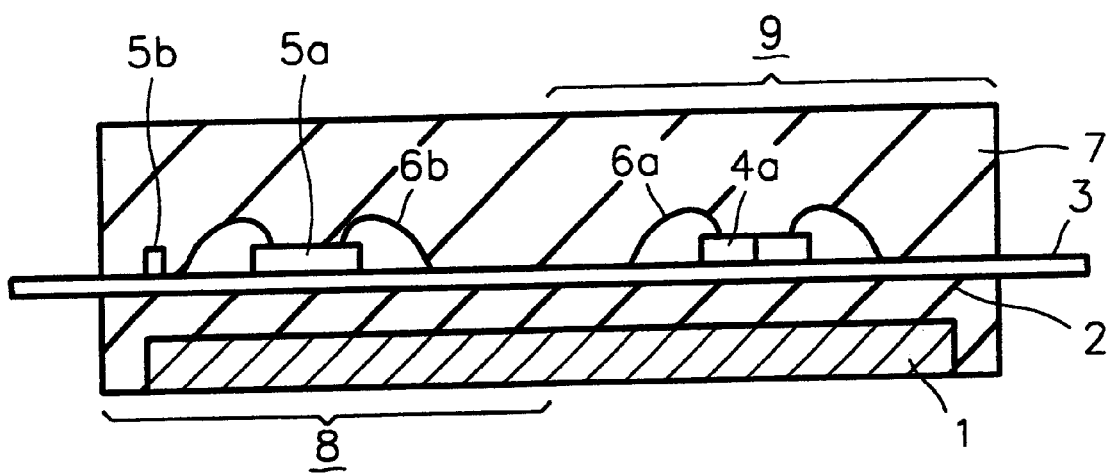
FIG. 1 is a cross sectional view of a conventional power module package.
Figure 2:
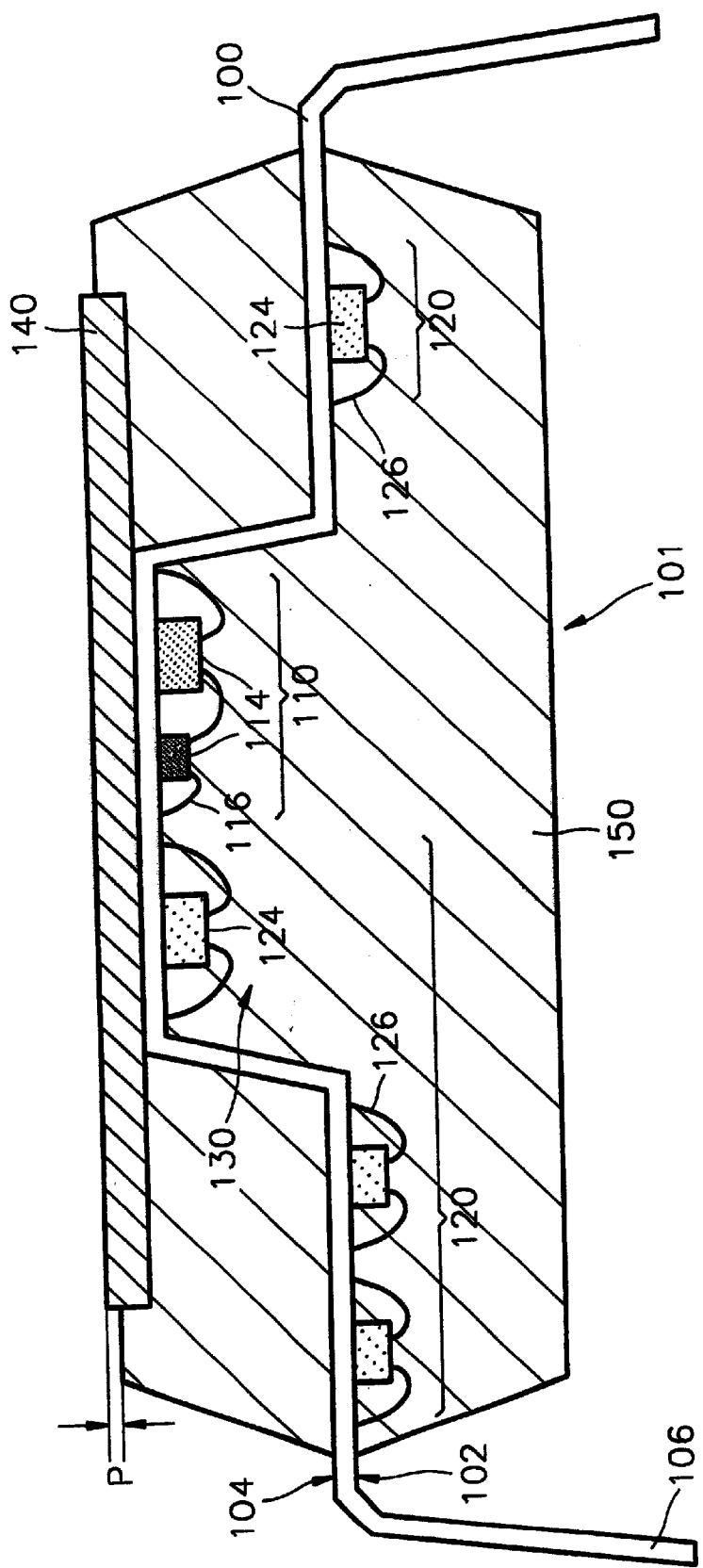
FIG. 2 is a cross sectional view of a power module package according to the present invention.

Referring to FIG. 2, a power module package 101 according to the present invention includes a lead frame 100, a heat sink 140, power circuit components 110, control circuit components 120 and an epoxy molding compound (EMC) 150. A down set 130 is formed near the center of the lead frame 100, thereby effectively radiating heat generated by a power circuit chip 114 to the outside of the power module package 101. To this end, the heat sink 140 made of an insulating material such as plastic or ceramic is directly attached to a second surface 104, which is the rear surface of the lead frame 100 on which the down set 130 is formed, so that the heat sink 140 may be exposed to the outside of the power module package 101.

Due to the structural characteristics, heat generated in the power circuit chip 114 can be effectively radiated to the outside, compared with the conventional method in which the heat sink and the rear surface of the lead frame contact each other through the resin. Furthermore, a process can be simplified since there is no need to use two EMCs having different properties, and the manufacturing cost can be lowered by using the heat sink 140 made of low cost ceramic or plastic instead of a heat sink made of copper.

The heat sink 140 can be manufactured by including one of $Al_2O_3$, AlN, $SiO_2$, and BeO. For example, in the case of a ceramic, a heat sink may be formed by including $Al_2O_3$, AlN, $SiO_2$, or BeO in materials of the ceramic. Furthermore, in the case of plastic, one of $Al_2O_3$, AlN, $SiO_2$, and BeO may be included in a filler of the plastic.

Meanwhile, the heat sink 140 is susceptible to thermal stress that may occur due to a difference in coefficient of thermal expansion between the adjacent EMC 150 and the lead frame 100. Thermal stress due to the difference in coefficient of thermal expansion may induce package warpage. In order to prevent the possibility of thermal stress-induced warpage, the heat sink 140 of a rectangular plate shape may be pre-bent less than 100 μm to compensate for the warpage of the heat sink 140. Furthermore, due to characteristics in a manufacturing process, the heat sink 140 projects from the top of the power module package 101 less than 0.1 mm.

The power circuit chip 114 and aluminum bonding wire 116, which are the power circuit components, are attached to the down set 130 of the lead frame 100 for ease of heat radiation. Reference numerals 102 and 104, respectively, denote a first surface which is the front side of the lead frame 100, and a second surface 104 which is a rear surface of the lead frame 100. Reference numerals 124 and 126, respectively, denote a control circuit chip and a gold wire.

Method of Manufacturing Power Module Package According to First Embodiment

Figure 3:
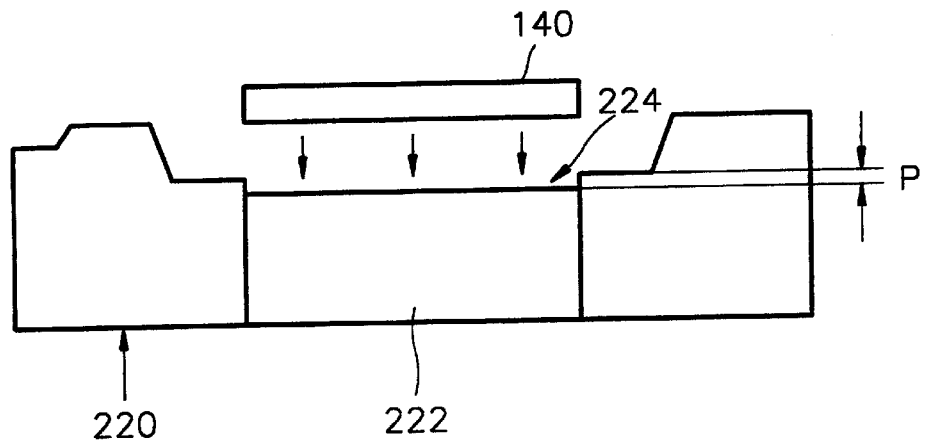
FIG. 3 is a cross sectional view showing the structure of a bottom mold die in a molding equipment used in a first embodiment of the present invention.
Figure 4:
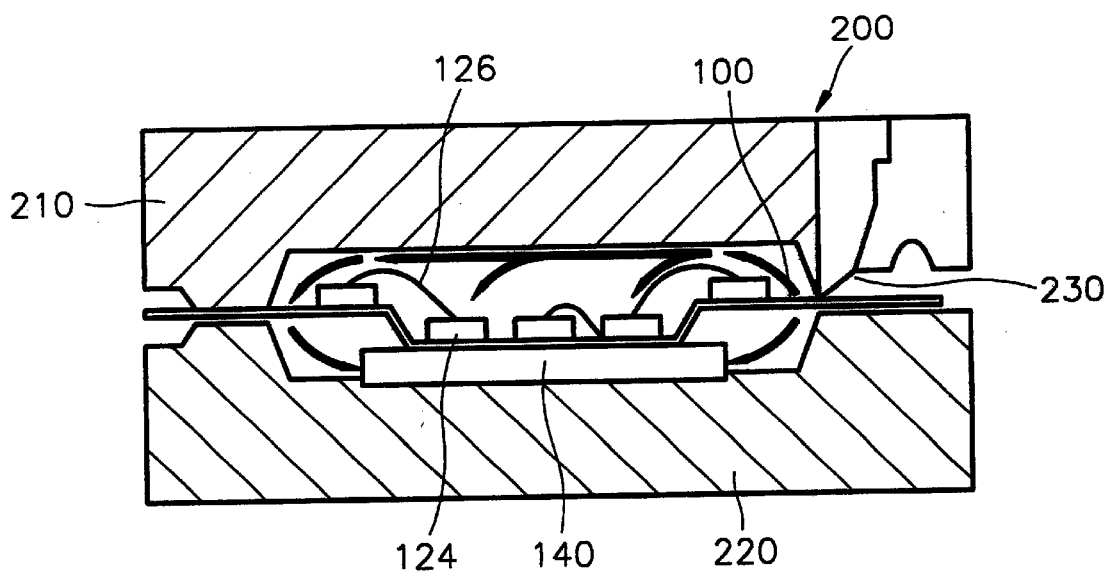
FIG. 4 is a cross sectional view showing a sealing process of a power module package according to a first embodiment of the present invention.

FIG. 3 is a cross sectional view showing the structure of a bottom mold die in a molding equipment used in a first embodiment of the present invention, and FIG. 4 is a cross sectional view showing a sealing process of a power module package according to a first embodiment of the present invention. Referring to FIGS. 2–4, in a first step, a power circuit chip 114 and a control circuit chip 124 are attached to a first surface 102 of a lead frame 100 by a die attach process. In this case, the power circuit 114 should be attached to a region of a down set 130. Subsequently, wire bonding is performed to properly connect the power circuit chip 114 with the control circuit chip 124. A gold wire 126 is used as a wire of the control circuit chip 124. As a wire for the power circuit chip 114 it is desirable to use an aluminum wire 116 having a diameter of 250–500 μm in order to sufficiently withstand high current rating. In the wire bonding process, bonding techniques known as wedge bonding and ball bonding are used. In order to perform wire bonding smoothly, the aluminum wire 116 is first bonded and then the gold wire 126 is bonded.

Next, the heat sink 140 is fixed to a groove 224 formed on the top of a heat sink block 222 of a bottom mold die 220. The depth of the groove 224 is preferably 0.05–0.1 mm, and the size thereof should be sufficient for the heat sink 140 to fit into it. The heat sink 140 is composed of plastic or ceramic including one of $Al_2O_3$, AlN, $SiO_2$, and BeO. Furthermore, in order to prevent package warpage, a pre-bent type heat sink, which is bent less than 100 μm, may be used as the heat sink 140. The heat sink 140 can be composed of a single layer, but multiple layers attached by an adhesive having good thermal properties may possibly be used.

After wire bonding is complete, the lead frame 100 is positioned at a molding equipment. In this case, the heat sink 140 remains to be fixed to the groove 224 of the bottom mold die 220. Then, a top mold die 210 comes down and an EMC is injected through a gate 230. The EMC remains liquified by heat and pressure, so that the EMC flows in a direction as depicted by an arrow to evenly fill the inner space of a mold 200. A transfer molding equipment having a plurality of gates and runners can be utilized as a molding equipment. A temperature for sealing is preferably 160–170° C.

When the lead frame 100 in which sealing has been complete, i.e., the power module package 101, is unloaded from the molding equipment, the heat sink 140 is attached directly to a second surface of the lead frame 100 on which the down set 130 is provided, and a surface to which the heatsink is not attached is protruded and exposed to the outside of the power module package 101. A lead which is an external terminal 106 is exposed to the outside as well. Then, a usually subsequent process including a trim & forming process is performed.

Method of Manufacturing Power Module Package According to Second Embodiment

Figure 5:
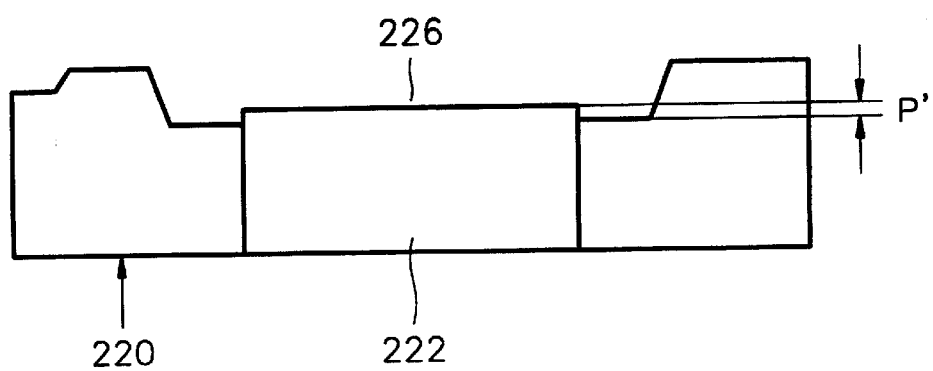
FIG. 5 is a cross sectional view showing a bottom mold die used in a molding equipment used in a second embodiment of the present invention.
Figure 6:
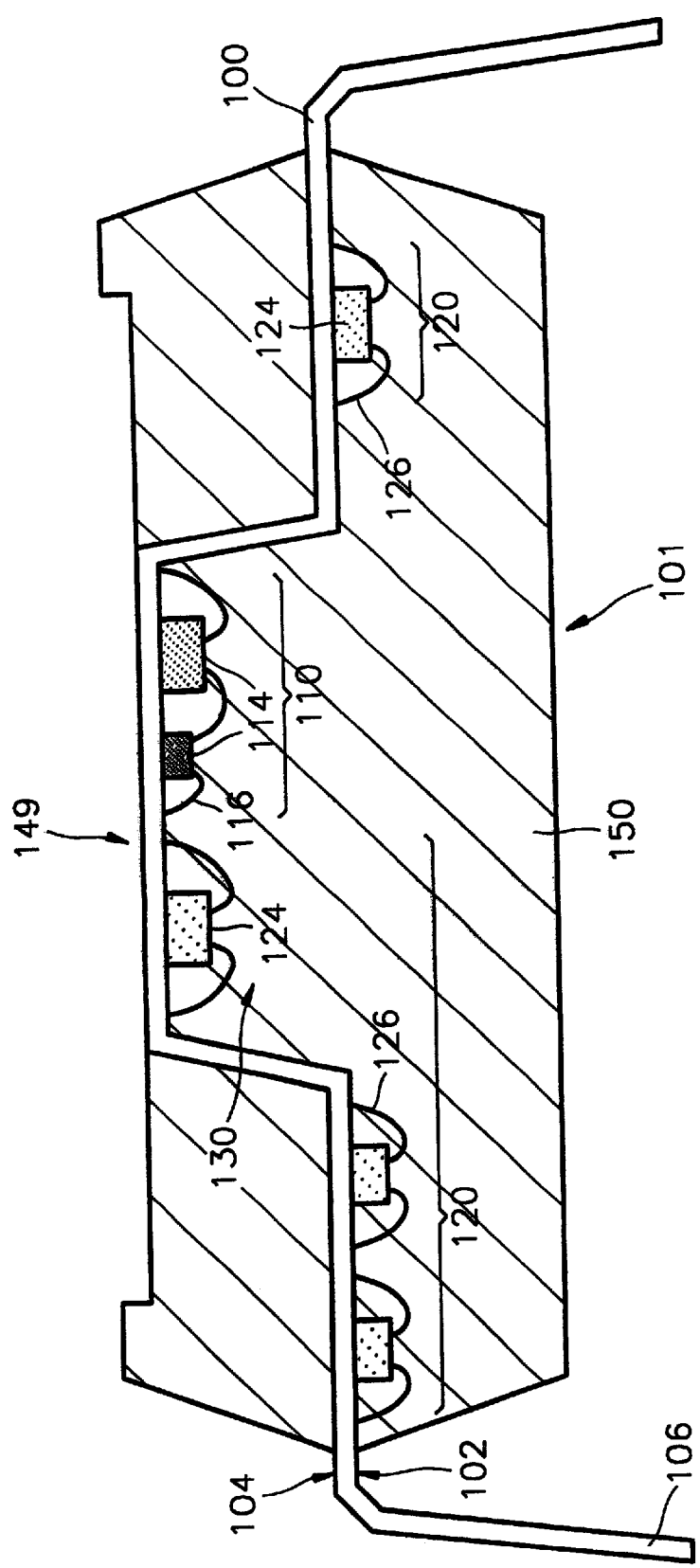
FIG. 6 is a cross sectional view showing the power module package when a sealing process according to the second embodiment has been completed.

FIG. 5 is a cross sectional view showing the structure of a bottom mold die in a bottom mold die used in a molding equipment used in a second embodiment of the present invention, and FIG. 6 is a cross sectional view showing the power module package when a sealing process according to the second embodiment has been completed. Referring to FIGS. 2, 5, and 6, in a second embodiment, a heat sink 140 is attached to a second surface of a lead frame 100 through a separate attaching process after exposing the second surface 104 of the lead frame 100 on which the down set 130 is provided, during a sealing process, while, in the first embodiment, the heat sink is directly attached to the second surface 104 of the lead frame 100 on which the down set 130 is formed.

The same process as that in the first embodiment is performed to mount power circuit components 114 and 116, and control circuit components 124 and 126 on a first surface of a lead frame 100 through a die attach process and wire boding process. After the wire bonding is complete, the lead frame 100 is positioned to a molding equipment. In this case, a protrusion portion 226 instead of a groove is formed on a bottom mold die 220 of the molding equipment. The protrusion portion 226 serves to expose a second surface 104 of the lead frame 100 on which a down set 130 is formed, to the outside of the power module package 101, when performing a sealing process.

Thus, after a sealing process is performed in the molding equipment as shown in FIG. 4, there exists a second surface 149 of the lead frame which is exposed to the outside with a step difference. Then, a separate attaching process is performed to attach the heat sink 140 to the second surface 149 of the lead frame 100 is exposed with a step difference to the outside using a liquid epoxy including a ceramic-based filler. Here, the ceramic-based filler refers to resin or hardener of a liquid epoxy in which a ceramic-based material such as $Al_2O_3$ or AlN.

Figure 7:
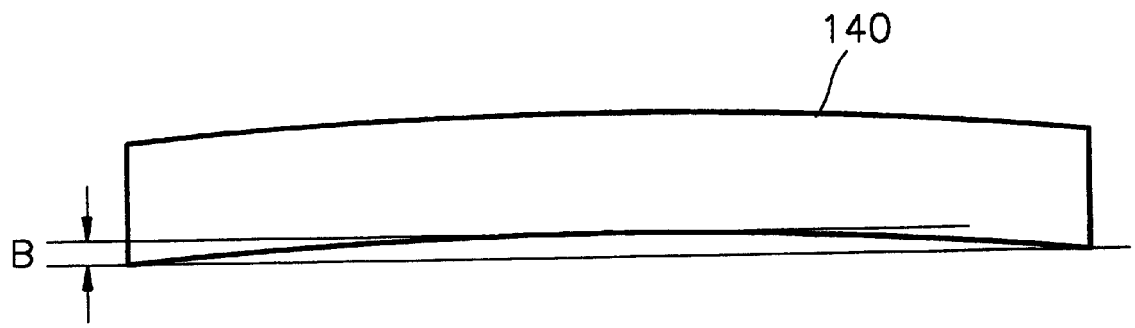
FIG. 7 is a cross sectional view of a heat sink used in the present invention.

Referring to FIG. 7 which is a cross sectional view of a heat sink used in the present invention, a rectangular plate can be used as a heat sink 140, but a pre-bent type heat sink can be used in order to compensate for package warpage that occurs due to a difference in coefficient of thermal expansion between the heat sink 140 and a power module package material adjacent thereto. The pre-bent type heat sink 140 is less than 100 µm bent. The pre-bent type heat sink 140 can compensate for warpage of a heat sink made of an insulating material.

First, a power module package according to the present invention can guarantee reliability by effectively radiating heat generated during operation of the power module package through a heat sink attached directly to the rear surface of a lead frame on which a down set is provided. As an example, when the structure and materials of a heat sink in a power module package under the same conditions were changed as shown in the present invention, heat transfer properties, i.e., a junction case Rθ jc and a junction ambient Rθ ja, were 0.15° C./Watt and 2.80° C./Watt respectively, while the correspondent values were 0.26° C./Watt and 3.02° C./Watt when using the conventional method. Therefore, the result demonstrated that a heat radiation characteristic was improved about 20–30% compared with the conventional art. Here, the junction case Rθ jc refers to a temperature difference from a PN junction of the power circuit chip 114 to a case which is a mold line, and a junction ambient Rθ ja refers to a temperature difference from the PN junction of the power circuit chip 114 to the external atmosphere.

Second, a process can be simplified and automated by performing a sealing process on a power module package by use of an EMC having the same properties at a time.

Third, the manufacturing cost can be lowered by manufacturing a power module package having a low cost heat sink instead of a metallic heat sink and simplifying a process.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A power module package comprising:
   a lead frame having a first surface, to which components for a power circuit and a control circuit are attached and on the center of which a down set is provided, and a second surface, to which a heat sink is attached, and edges on which external terminals are provided;
   a heat sink having one surface attached directly to the second surface of the lead frame projected by the down set, and the other surface exposed to the outside of a power module package, the heat sink being formed of an insulating material having good heat transfer properties;
   components for the power circuit which are mounted on a portion of the first surface of the lead frame on which the down set is formed;
   components for the control circuit which are mounted on the first surface of the lead frame; and
   an epoxy molding compound which encapsulates the lead frame and the heat sink excluding the external terminals of the lead frame and the one side of the heat sink.

2. The power module package of claim 1 wherein the heat sink formed of an insulating material having good heat transfer properties is composed of plastic or ceramic.

3. The power module package of claim 2, wherein the heat sink is formed by including at least one of $Al_2O_3$, AlN, $SiO_2$, and BeO.

4. The power module package of claim 1, wherein the heat sink is a pre-bent plate for preventing package warpage.

5. The power module package of claim 4, wherein the heat sink is pre-bent less than 100 µm.

6. The power module package of claim 1, wherein the heat sink is protruded slightly more than the epoxy molding compound.

7. The power module package of claim 1, wherein the heat sink is protruded 0.05–0.1 mm more than the epoxy molding compound.

8. A method of manufacturing a power module package comprising the steps of:
   preparing a lead frame on the center of which a down set is provided and on the edges of which external terminals are provided;
   attaching a plurality of chips for serving as a power circuit and a control circuit to a first surface of the lead frame and performing wire bonding;

positioning the lead frame to a molding equipment for attaching a heat sink formed of an insulating material to a bottom mold die; and sealing the lead frame by an epoxy molding compound in the molding equipment so that the heat sink may be attached to the second surface of the lead frame on which the down set is formed, and that the external terminals and a surface opposing the surface of the heat sink to which the lead frame is attached may be exposed to the outside.

9. The method of claim 8, wherein a groove for fixing the heat sink is formed on the bottom mold die of the molding equipment.

10. The method of claim 9, wherein the depth of the groove is 0.05–0.1 mm from the surface of the bottom mold die.

11. The method of claim 8, wherein the heat sink is composed of plastic or ceramic including one of $Al_2O_3$, AlN, $SiO_2$, and BeO.

12. The method of claim 8, wherein a pre-bent plate is used as the heat sink.

13. A method of manufacturing a power module package comprising the steps of:

preparing a lead frame on the center of which a down set is provided and on the edges of which external terminals are provided;

attaching a plurality of chips for serving as a power circuit and a control circuit to a first surface of the lead frame and performing wire bonding;

positioning the lead frame to a molding equipment in which a protrusion portion for attaching a heat sink to a bottom lower die in a subsequent process is formed;

sealing the lead frame by an epoxy molding compound in the molding equipment so that a recessed surface including the second surface of the lead frame, on which the down set is provided, and the external terminals of the lead frame may be exposed; and attaching the heat sink to the recessed portion including the second surface of the lead frame exposed to the outside.

14. The method of claim 13, wherein the height of the protrusion portion is 1–3 mm.

15. The method of claim 13, wherein the heat sink is composed of materials including one selected from the group consisting of $Al_2O_3$, AlN, $SiO_2$, and BeO.

16. The method of claim 13, wherein the heat sink is attached to the second surface of the lead frame by a liquid epoxy including a ceramic-based filler.

17. The method of claim 13, wherein a pre-bent plate is used as the heat sink in order to prevent package warpage.

18. The method of claim 13, wherein the heat sink is comprised of multiple layers attached by an adhesive.

* * * * *